United States Patent [19]

Dunn et al.

[11] Patent Number: 4,792,377
[45] Date of Patent: Dec. 20, 1988

[54] FLUX GROWTH OF SODIUM BETA" ALUMINA

[75] Inventors: Bruce S. Dunn, Los Angeles; Peter E. D. Morgan, Thousand Oaks, both of Calif.

[73] Assignee: The Regents of the University of California, Berkeley, Calif.

[21] Appl. No.: 12,198

[22] Filed: Feb. 9, 1987

[51] Int. Cl.$^4$ .......................... C30B 9/12; C30B 15/02
[52] U.S. Cl. .................................. 156/624; 156/617.1; 156/620.5; 156/DIG. 61; 423/119; 423/600; 501/86; 501/153
[58] Field of Search ......... 156/617 SP, 624, DIG. 61, 156/617.1, 620.5; 501/86, 153; 423/119, 600

[56] References Cited

U.S. PATENT DOCUMENTS

| 3,253,975 | 5/1966 | Olcott et al. | 501/153 |
| 3,715,194 | 2/1973 | Ploaster | 156/617 SP |
| 3,915,656 | 10/1975 | Mlavsky et al. | 156/617 SP |
| 3,917,462 | 11/1975 | Yancey | 156/DIG. 61 |

FOREIGN PATENT DOCUMENTS

| 1598617 | 7/1970 | France | 156/DIG. 61 |
| 1386244 | 8/1972 | United Kingdom | 501/153 |

OTHER PUBLICATIONS

Ray et al., Synthesis of Sodium B and B" Alumina, Mat. Res. Bull., vol. 10, No. 6, (Jun.), pp. 583-590, 1975.
Article entitled "Synthesis of $Co^{2+}$ and $Ni^{2+}$ Stabilized Beta"-Alumina" by S. Chen, D. R. White and H. Sato of School of Materials Engineering, and C. J. Sandberg and H. R. Harrison of Purdue University.
"Recent Developments in Beta" Alumina", Article by B. Dunn and G. C. Farrington, Solid State Ionics 18 & 19, (1986), pp. 31-39, North-Holland Publishing Company.
Article entitled "Trivalent Ion Exchange in Beta" Alumina" by B. Dunn and G. C. Farrington, Solid State Ionics 9 & 10, (1983), pp. 223-226, North-Holland Publishing Company.
Article entitled "Li and Mg Stabilized Beta Aluminas" by W. L. Roth, R. E. Benenson, V. K. Tikku, J. L. Briant, & B. Dunn, General Electric CRD Corporate Research and Development, Technical Information Series Class 1, Report No. 81CRD185, Aug. 1981.
Article entitled "Divalent Beta"-Aluminas: High Conductivity Solid Electrolytes for Divalent Cations" by G. C. Farrington & B. Dunn, Solid State Ionics, vol. 7, No. 4, Dec. 1982, North-Holland Publishing Company.

Primary Examiner—John Doll
Assistant Examiner—Robert M. Kunemund
Attorney, Agent, or Firm—Poms, Smith, Lande & Rose

[57] ABSTRACT

A method for growing crystals of sodium beta" alumina is described. The crystals are grown by Czochralski type processes or analogous methods wherein single crystals are formed from a flux or melt. The melt is a eutectic type liquid primarily containing Na or K, (Li, Mg or other divalent element, e.g. $Ni^{2+}$, $Co^{2+}$, $Cr^{2+}$, $Fe^{2+}$, etc.) Al, in proportions to produce beta" alumina. To lower the melt temperature to where e.g. $NA_2MgAl_{10}O_{17}$ beta" or $Na_2Li_{\frac{1}{2}}Al_{1\frac{1}{2}}O_{17}$ beta" can crystallize in its stability region (approximately less than 1700° C. for the Mg version and approximately less than 1600° C. for the Li version) high valent ions, which do not enter the structure, particularly $V^{5+}$, $Nb^{5+}$, $Ta^{5+}$, $Zr^{4+}$ and/or $Hf^{4+}$ are added to the melt. The method has allowed the growth of single crystals of the Li-stabilized sodium and potassium varieties for the first time.

21 Claims, No Drawings

FLUX GROWTH OF SODIUM BETA" ALUMINA

This invention was made with Government support under Contract No. N00014-83-K-0498 awarded by the Office of Naval Research. The Government has certain rights in this invention.

BACKGROUND OF THE INVENTION

The present invention relates to methods for producing several varieties of beta" alumina (beta double prime alumina). More particularly, the present invention relates to a method for growing high quality single crystals of beta" alumina from a homogeneous melt using a Czochralski type process or analogous procedure.

Beta" aluminas are a large family of rhombohedral compounds typified by the well known $Na_2MgAl_{10}O_{17}$ type. Na may be regplaced by K, Rb, Cs. Mg is replaceable by other divalent cations such as $Ni^{2+}$, $Co^{2+}$, $Cr^{2+}$, $Fe^{2+}$ and others with a similar cation radius as $Mg^{2+}$. It is also replaceable with $\frac{1}{2}Li^+$ (balanced by $10\frac{1}{2}Al^{3+}$). Many of these compounds, in particular the K and Li varieties are not achievable by the older method of crystal growth from a $NaAlO_2$ (or $KAlO_2$, etc.) melt because the beta" variety has an upper temperature stability below the melt temperature, e.g. "$Na_2Li_{\frac{1}{2}}Al_{10\frac{1}{2}}O_{17}$" is not stable above 1600° C. and "$K_2Li_{\frac{1}{2}}Al_{10\frac{1}{2}}O_{17}$" is unstable above appproximately 1300° C.

Beta" aluminas have become one of the most widely investigated solid electrolytes. The remarkable ion exchange characteristics of the beta" aluminas have been of particular interest. Both divalent and trivalent cations have been found to diffuse rapidly into the beta" alumina structure to provide high conductivity solid electrolytes.

$H_3O^+$, hydronium (and other species such as $NO_2^+$) are also known to exchange with beta" aluminas. A particularly important one is the $H_3O^+$ exchange which produces a proton conducting material (e.g. for fuel cells). $H_3O^+$ exchange with the Na beta" causes cracking of the crystal but does not impair the potassium beta" crystal structure because of the size similarity of $K^+$ and $H_3O^+$.

The ability of beta aluminas to accept monovalent, divalent and trivalent cations is expected to allow the production of a wide variety of materials having interesting properties in addition to the already known fast ion transport characteristics of such cation doped beta" aluminas. For example, the ability of neodymium exchanged beta double prime alumina to exhibit interesting optical and laser properties was recently reported by M. Jansen, et al (M. Jansen, A. Alfrey, O. N. Stafsudd, D. L. Yang, B. Dunn and G. C. Farrington, OPT. LETTS. 9 (1984) 119).

The diffusional doping of beta" alumina with various cations such as neodymium involves two basic steps. First, it is necessary to prepare single crystals of beta" alumina. Then, the crystals are ion exchanged to replace the alkali ions with the desired replacement cation. In order for useful cation doped crystals to be prepared, it is essential that a method be provided for growing large optical quality beta" alumina single crystals. The ability to provide a method for growing high quality large beta" alumina crystals will ultimately determine the applications and usefulness of the devices based on cation exchanged beta" alumina.

Flux evaporation is the only technique which has been successfully used so far to grow reasonably large single crystals of sodium beta" alumina. This method involves volatilization of sodium from a Mg containing melt in the beta alumina-$NaAlO_2$ composition to form magnesium stablized sodium beta" alumina. Neither lithium stabilized sodium beta" or any potassium beta" has been grown by this kind of technique.

Although the flux method yields crystals of suitable quality and size for use in testing optical behavior, there have been problems in utilizing the flux evaporation method to produce crystals on a large scale for widespread applications. Particularly, the crystals produced by flux volatilization are generally not uniform in size and have variable optical quality.

A particular problem is that the Mg beta" variety that has been grown is susceptible to topotactic intergrowths of narrow layers of beta', beta''' and beta$^{IV}$ varieties which are contiguous components in the Na-Mg-Al-O phase diagram. As addressed here, the Li variety has the advantage that beta''' and beta$^{IV}$ varieties (with 6 layer spinel block types) are unknown and do not form. In associated powder work, the Li variety is more easily produced phase pure than the Mg version, i.e. lacking topotactical intergrowth.

Skull melting is another crystal growth technique which has been used to prepare single crystals of sodium beta" alumina (see S. Chen, D. R. White, H. Sato, C. J. Sandburg and H. R. Harrison, Proceedings Of The Conference on High Temperature Solid Oxide Electrolytes, Brookhaven National Laboratory, F. J. Salzano, Ed. Vol. 2, 121 (1983). The crystals resulting from skull melting growth techniques are generally too small even for use in testing the optical properties of the crystals once they are doped with a desired cation. Again, the technique is not of use above the stability temperature of the particular beta" desired.

It is well known that laser quality crystals of large size can be grown from a homogeneous melt using the Czochralski process or an analogous procedure. Czochralski type processes have not been used to grow sodium beta" alumina crystals because it is well known that sodium beta" alumina melts incongruently. Accordingly, Czochralski methods have in the past been thought to be not feasible for use in growing beta" alumina crystals. The possibility of using mixed eutectic melts to produce beta" alumina is complicated because of the beta" alumina's ability to exchange many different ions. It was feared that in a Czochralski type process, the exchange of ions from the additives would lead to impurities and contamination of crystals pulled from the melt in a Czochralski type process.

There presently is a need to provide a process for preparing large high quality beta" alumina crystals having both uniform optical quality and uniform size. The development of such a method will provide a convenient source of beta" alumina crystals for use in experimentation and commercial applications.

SUMMARY OF THE INVENTION

In accordance with the present invention, a method is provided for growing uniformly high optical quality beta" alumina crystals having any desired size. The invention involves the discovery that certain high valence agents can be added to beta" alumina type melts to form a homogeneous melt in which beta" aluminas can be crystallized out. The high valence agents were discovered not to introduce impurities or contaminants into the beta″ alumina crystals. The melts produced in accordance with the present invention can be used in Czochralski processes or analogous procedures to grow crystals of any desired shape or size.

The present invention involves the steps of adding one part by weight of a high valence alkali salt to from 1 to 5 parts by weight of beta″ alumina to form a melt mixture. This melt mixture is then heated to a temperature which is below the decomposition temperature of the particular beta″ alumina. This resulting melt is maintained at a temperature below the decomposition temperature of the beta″ alumina. The melt is then used in Czochralski type processes wherein a single crystal of beta″ alumina is pulled from the homogeneous melt.

To lower the melt temperature of the desired beta″ target the addition of the appropriate alkali salts (Li, Na, K, etc.) of high valent elements such as $V^{5+}$, $Nb^{5+}$, $TA^{5+}$, $Zr^{4+}$, $Hf^{4+}$ or $Si^{4+}$ is used. None of these elements, in the presence of excess alkali, enter the beta″ lattice. The use of high valence alkali compounds of these elements e.g. $Na_3VO_4$, $NaNbO_3$, $Na_2SiO_3$, $Na_2TiO_3$, $K_3VO_4$, $KVO_2$, $Na_2WO_4$, $Na_2MoO_4$, $NaTaO_3$, $Na_2ZrO_3$, $Na_2W_2O_7$, $Na_2Mo_2O_7$, $K_2SiO_3$, $K_2TiO_3$, $KTaO_3$, $K_2ZrO_3$, $K_2W_2O_7$, $K_2Mo_2O_7$ etc. in conjunction with $NaAlO_2$, $KAlO_2$ in ternary or higher melts has the added advantage that the melt, after cooling, is soluble in water or dilute acid so that the beta″ alumina crystals can be separated and purified with relatively benign chemistry.

An important feature of the use of high valence agents in accordance with the present invention is that the stabilizing agents allow the formation of a homogenous and stable melt at temperatures below 1600° C. This is significant because Na-Li and K-Li or K-Mg beta″ aluminas become unstable at temperatures at or above about 1650° C. and 1300° C., respectively. This allows the pure beta″ alumina to be formed as opposed to other processes, such as the flux evaporation process where temperatures in the range of 1700° C. are required.

Although the main melt constituents e.g. alkali, high valence ion and aluminum produce beta″ alumina, the incorporation of other elements deliberately into the beta″ crystal is also feasible via the addition for example of the divalent transition metal ions such as $Ni^{2+}$, $Co^{2+}$, $Cr^{2+}$, $Fe^{2+}$, etc. to the melt.

The above-discussed and many other features and attendant advantages of the present invention will become apparent as the invention becomes better understood by reference to the following detailed description.

DESCRIPTION OF THE INVENTION

The present invention involves the use of high valence ions in a melt of beta″ alumina in order to lower the melting temperature and allow the beta″ alumina congruently to crystallize so that crystals can be pulled from the melt by conventional Czochralski processes or analogous procedures within the stability regime of the particular beta″ alumina desired.

Preparation of the melt in accordance with the present invention is carried out according to conventional procedures for forming melts to be used in a Czochralski process. The melt mixture includes beta″ alumina, the high valence agent, and a source of alkali ion and the divalent element for use in forming the alkali beta″ alumina crystal.

Beta″ alumina is a widely available compound having the general formula 80 mole percent $Al_2O_3$–15 mole percent $Na_2O$–5 mole percent $Li_2O$. Generically the beta″ group is defined by having rhombohedral symmetry, R3m, with 3 layers of spinel blocks (each with 4 oxygen layers) in the unit cell. Between the spinel blocks are the open, fast ion conducting, interspinel layers. This symmetry contrasts with the P6$_3$/mmc hexagonal symmetry of the beta″ alumina type. The spinel blocks contain mostly $Al^{3+}$ and $O^{2-}$ ions but also small amounts of monovalent or divalent ions e.g. $Li^+$, $Mg^{2+}$, $Ni^{2+}$, $Co^{2+}$, $Fe^{2+}$, $Cr^{2+}$, are necessary to stabilize the structure allowing it to crystallize congruently from the melt. The interspinel layers contain the mobile large alkali ions, typically $Na^+$, $K^+$, $Rb^+$ or $Cu^+$.

The high valence agents which are added to the beta″ melts include single or mixed alkali high valent metal oxides wherein the valence of the metal cation is +4, +5 or plus +6. Representative high valence agents include $LiVO_3$, $Li_3VO_4$, $LiNbO_3$, $LiTaO_3$, $Li_2ZrO_3$, $Li_2TiO_3$, $Li_2SiO_3$, $Li_2W_2O_7$, and $Li_2Mo_2O_7$ and corresponding compounds where sodium or potassium is partly substituted for lithium. These additives function by providing a source of lithium for stabilizing the beta″ structure. They enable the formation of a homogenous and stable melt at temperatures between about 1300° C. and 1650° C.

In the particular case of preparing single crystals of "$Na_2Li_{\frac{1}{3}}Al_{11\frac{1}{3}}O_{17}$" the melt would consist of the above composition $+NaAlO_2+Na_3VO_4+LiAlO_2$ such that the above composition congruently crystallizes out (In this case all other elements remain in the melt).

Although beta double prime alumina is known to be susceptible to complete or partial ion exchange with cations of valences of +1, +2, +3 and +4 when they are in excess, it was found that the high valence metal ions provided for congruent melting without being incorporated into the beta″ structure.

In addition to the beta″ alumina and high valence agent, the melt must include a source of alkali ion for incorporation into the beta″ alumina structure to form the alkali beta″ alumina crystals. Suitable compounds for use in providing the alkali ion source are $NaAlO_2$, $Na_3VO_4$, $NaVO_3$, $NaNbO_3$, $NaTaO_3$, $Na_2ZrO_3$, $Na_2W_2O_7$ $Na_2TiO_3$, $Na_2SiO_3$ and $Na_2Mo_2O_7$ and the related potassium analogues. Sodium aluminate ($NaAlO_2$) is the preferred sodium ion source.

It is preferred that the alkali ion source be present in the melt so that alkali ion is provided for incorporation into the beta″ alumina structure. Typically, a weighted amount of sodium aluminate equal to the weight amount of beta″ alumina is added to the melt. The actual amount of sodium aluminate or other alkali ion source added to the melt is not particularly critical so long as an amount is present which is sufficient to provide formation of a homogeneous melt of sodium beta″ alumina. It is preferred that an excess be added in order to ensure complete incorporation of sodium into the beta″ alumina structure.

With regard to the amount of high valence agent added to the beta″ alumina, it is necessary that about one part by weight of high valence agent be added for every 1 to 5 parts by weight of beta″ alumina. Preferably, one part by weight high valence agent is added for every two parts by weight beta″ alumina. The alkali ion source is preferably present in an amount greater than 1 part by weight per 1 part by weight of high valence agent.

After the three ingredients for the melt mixture are combined, the melt is then heated to a temperature of between about 1300° C. and 1650° C. It was discovered that suitable melts from which crystals could be pulled according to the Czochralski technique could be formed within this temperature range. The preferred melt temperature is between about 1300° C. and 1600° C. This temperature range is preferred because it provides a homogenous and stable melt at a temperature well below the temperature at which beta" aluminas become unstable and transform to beta alumina.

Once having formed the melt in accordance with the present invention, single crystals can be pulled from the melt in accordance with conventional Czochralski type techniques or analogous procedures. The size of the seed crystals used in initiating pulling of the crystal from the melt along with pulling rates and rotation rates can be varied widely in accordance with the conventionally known Czochralski procedures. These parameters are routinely determined for each melt depending upon the desired size, quality and shape of the crystal.

After the crystals of sodium beta" alumina are pulled from the melt according to the well known Czochralski techniques, the crystals can then be processed by conventional well-known techniques, if necessary, to provide crystals for experimentation or commercial applications.

Examples of practice are as follows:

EXAMPLE 1

Sodium aluminate and lithium vanadate were mixed with beta" alumina to provide a melt mixture having two parts by weight sodium aluminate, one part by weight lithium vanadate and two parts by weight beta" alumina. This mixture was heated to a temperature of 1590° C. in an air atmosphere. The mixture was held at this temperature for one hour and then cooled at a rate of 6° C. per hour until reaching the temperature of 1200° C. The mixture was then furnace cooled to room temperature. This resulted in the formation of small, thin but well formed crystallites of sodium beta" alumina.

EXAMPLE 2

The same mixture as in Example 1 was heated to a 1590° C. in air and again held at this temperature for one hour. The melt was then cooled at a rate of 1° C. per hour until a temperature of 1400° C. was reached. The melt was then furnace cooled to room temperature. The resulting crystals were substantially larger than those formed in Example 1. The crystals ranged in size from 1 to 2 mm.

In both Examples 1 and 2, the melts were quite stable and exhibited little volatilization. X-ray diffraction measurements confirmed the presence in both examples of well-formed sodium beta" alumina with little or no syntactic growth of other phases. The use of lithium vanadate as the stabilizing agent is preferred because it allows the removal of residual flux by water or dilute hydrochloric acid. Lattice parameter values for the crystals formed in Examples 1 and 2 were consistant with those of flux grown materials (a=5.607 A; c=33.593 A). The sodium content of the crystals were also obtained by ion exchange with silver ion. The composition of the crystals was found to correspond to $Na_{1.62}Li_{0.31}Al_{10.69}O_{17}$. The procedure used assumed that only sodium ion was removed during the ion exchange with silver and that non-stoichiometry is charge balanced by lithium ions in the spinel block.

EXAMPLE 3

A flux mixture was prepared in the same fashion as in Examples 1 and 2 except that lithium niobate was substituted for lithium vanadate. The same melting conditions and cooling procedures were used as in each example. The melts again were quite stable and exhibited very little volatilization. Well-formed crystallites of sodium beta" alumina were again produced.

EXAMPLE 4

Sodium aluminate and lithium aluminate are combined with (1) a mixture of equal weight parts of sodium vanadate and lithium vanadate and (2) beta" alumina ($Na_{1.62}Li_{0.31}Al_{10.69}O_{17}$) to provide a melt mixture having 1 part by weight sodium aluminate, 1 part by weight lithium aluminate, 1 part by weight of the sodium vanadate and lithium vanadate mixture and 2 parts by weight beta" alumina. The mixture is heated to about 1590° C. to form a prototypical or archetypical melt and then cooled at a rate of around 6° C. per hour until reading a temperature of about 1200° C. The melt is then furnace cooled to room temperature in order to form crystals of beta" alumina.

The above examples demonstrate that homogenous melts of congruently melting sodium beta alumina can be formed using the high valence stabilizing agents in accordance with the present invention and that these stabilized melts can be utilized in Czochralski type processes to grow high quality crystals of acceptable sizes.

EXAMPLE 5

A melt from Examples 1 and 2 or 3 and 4 is maintained in a Czochralski crucible at a temperature of 1590° C. A seed crystal of sodium beta" alumina is then contacted with the melt. The seed crystal has the approximate dimensions of 2 mm×4 mm×1 mm thick. The seed crystal is then pulled away from the melt at a speed of from 0.5 mm/hr to 5 mm/hr. The seed crystal is rotated at a conventional Czochralski rotation rate. The atmosphere present during crystal pulling can be air, but is preferably an inert atmosphere such as argon or nitrogen. The crystal of sodium beta" alumina which is pulled from the melt by the seed crystal is recovered and further processed, if necessary, for use in experimental or commercial applications.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein but is only limited by the following claims.

What is claimed is:

1. A method for growing crystals of alkali-beta" alumina and an alkali ion source;
   producing a melt comprising a high valence agent to lower the eutectic temperature, beta" alumina and an alkali ion source;
   heating said melt mixture to a temperature below the decomposition temperature of beta" alumina and an alkali ion source;
   heating said melt mixture to a temperature below the decomposition temperature of beta" alumina to form a homogeneous melt of alkali-beta" alumina;

cooling the homogeneous melt of alkali-beta" alumina at a sufficient rate to form a crystal of alkali-beta" alumina.

2. A method for growing crystals of alkali beta" alumina according to claim 1 wherein said melt comprises about 1 part by weight high valence agent, from 1 to 5 parts by weight beta" alumina and about 1 part by weight alkali ion source.

3. A method for growing crystals of alkali beta" alumina according to claim 1 wherein said high valence agent is selected from the group consisting of $LiVO_3$, $Li_3VO_4$, $LiNbO_3$, $LiTaO_3$, $Li_2ZrO_3$, $Li_2TiO_3$, $Li_2SiO_3$, $Li_2W_2O_7$, and $Li_2Mo_2O_7$.

4. A method for growing crystals of alkali beta" alumina according to claim 1 wherein said high valence agent is selected from the group consisting of $NaVO_3$, $Na_3VO_4$, $NaNbO_3$, $NaTaO_3$, $Na_2ZrO_3$, $Na_2TiO_3$, $Na_2SiO_3$, $Na_2W_2O_7$ and $Na_2Mo_2O_7$.

5. A method for growing crystals of alkali beta" alumina according to claim 3 wherein said high valence agent is $LiVO_3$ or $LiNbO_3$.

6. A method for growing crystals of alkali beta" alumina according to claim 1 wherein said alkali ion source is selected from the group consisting of $NaAlO_2$, $NaVO_3$, $Na_3VO_4$, $NaNbO_3$, $NaTaO_3$, $Na_2ZrO_3$, $Na_2W_2O_7$, and $Na_2Mo_2O_7$.

7. A method according to claim 1 wherein said alkali ion source is selected from the group consisting of $KAlO_2$, $KVO_3$, $K_3VO_4$, $KNbO_3$, $KTaO_3$, $K_2ZrO_3$, $K_2W_2O_7$ and $K_2Mo_2O_7$.

8. A method for growing crystals of alkali beta" alumina according to claim 6 wherein said ion source is $NaAlO_2$.

9. A method for growing crystals of alkali beta" alumina according to claim 1 wherein said alkali ion source is present in an amount greater than 1 part by weight per 1 part by weight of high valence agent.

10. A method for growing crystals of alkali beta" alumina according to claim 1 wherein said melt mixture is heated to a temperature of between about 1300° C. and 1650° C.

11. A method for growing crystals of alkali-beta" alumina according to claim 10 wherein said melt mixture is heated to a temperature of between about 1300° C. and 1600° C.

12. A method for growing crystals of alkali beta" alumina according to claim 1 wherein said high valence agent is $LiVO_3$ and said alkali ion source is $NaAlO_2$.

13. A method for growing crystals of alkali beta" alumina according to claim 12 wherein the ratio by weight of $NaAlO_3$:$LiVO_3$:beta" alumina is 2:1:2.

14. A method for growing crystals of alkali beta" alumina according to claim 1 wherein said high valence agent is $LiNbO_3$ and said alkali ion source is $NaAlO_3$.

15. A method for growing crystals of alkali beta" alumina according to claim 14 wherein the ratio by weight of $NaAlO_3$:$LiNbO_3$:beta" alumina is 2:1:2.

16. A method for growing crystals of alkali-beta" alumina according to claim 1 wherein said alkali ion source is a mixture of $NaAlO_2$ and $LiAlO_2$ and said beta" alumina is ($Na_{1.62}Li Al_{10.69} O_{17}$).

17. A method for growing crystals of sodium beta" alumina according to claim 16 wherein said alkali ion source includes 1 part by weight $NaAlO_2$ and 1 part by weight and $LiAlO_2$.

18. A method for growing crystals of beta" alumina according to claim 16 wherein $NaAlO_2$ is replaced with $KAlO_2$.

19. A method for growing crystals of beta" alumina according to claim 1 wherein cooling of said melt mixture is provided by contacting a seed crystal with said melt mixture and then pulling said seed crystal away from said melt at a speed sufficient to provide formation of a crystal of beta" alumina associated with said seed crystal as said seed crystal is pulled away from said melt.

20. A method for growing crystals of alkali-beta" alumina according to claim 16 wherein said high valence agent is a mixture of $NaVO_3$ and $LiVO_3$.

21. A method for growing crystals of alkali-beta" alumina according to claim 20 wherein the lithium ions in $LiAlO_2$ and $LiVO_3$ are replaced with a divalent metal selected from the group consisting of $Mg^{2+}$, $Co^{2+}$, $Ni^{2+}$, $Fe^{2+}$ and $Cr^{2+}$ and the beta" alumina is replaced with the analogous potassium composition.

* * * * *